(12) United States Patent
Cheng et al.

(10) Patent No.: US 6,235,693 B1
(45) Date of Patent: May 22, 2001

(54) LACTAM COMPOSITIONS FOR CLEANING ORGANIC AND PLASMA ETCHED RESIDUES FOR SEMICONDUCTOR DEVICES

(75) Inventors: Jun Cheng, Cupertino; Robert J. Small, Dublin; Bakul P. Patel, Pleasanton, all of CA (US)

(73) Assignee: EKC Technology, Inc., Hayward, CA (US)

(*) Notice: Subject to any disclaimer, the term of this patent is extended or adjusted under 35 U.S.C. 154(b) by 0 days.

(21) Appl. No.: 09/354,834

(22) Filed: Jul. 16, 1999

(51) Int. Cl.[7] .................... C11D 7/04; C11D 7/32; C11D 7/50

(52) U.S. Cl. .............. 510/175; 510/176; 510/245; 510/255; 510/257; 510/258; 510/264; 269/269; 269/272; 269/500; 269/506

(58) Field of Search .................. 510/175, 178, 510/245, 255, 257, 258, 264, 269, 272, 500, 506, 176; 134/1.3, 42

(56) References Cited

U.S. PATENT DOCUMENTS

| | | | |
|---|---|---|---|
| 5,792,274 | * | 8/1998 | Tanabe et al. ............ 134/1.3 |
| 5,962,385 | * | 10/1999 | Maruyama et al. ......... 510/176 |
| 6,030,932 | * | 2/2000 | Leon et al. ............... 510/175 |

* cited by examiner

*Primary Examiner*—Gregory Delcotto
(74) *Attorney, Agent, or Firm*—Pennie & Edmonds LLP

(57) ABSTRACT

A composition for the cleaning of residues from substrates from about 0.01 percent by weight to about 10 percent by weight of one or more fluoride compounds, from about 20 percent by weight to about 50 percent by weight water, from about 20 percent by weight to about 80 percent by weight of an lactam solvent and from 0 to about 50 weight percent of an organic sulfoxide or glycol solvent. The composition has a pH between about 6 and about 10. Additionally, the composition optionally contains corrosion inhibitors, chelating agents, surfactants, acids and bases. In use of the composition, a substrate is contacted with the composition for a time and at a temperature that permits cleaning of the substrate.

21 Claims, 5 Drawing Sheets

Cleaning Triangle with patterned wafers at room temperature for 5 minutes. Clean line: 1 - poor, 10 - complete.

LACTAM COMPOSITIONS FOR CLEANING ORGANIC AND PLASMA ETCHED RESIDUES FOR SEMICONDUCTOR DEVICES

BACKGROUND OF THE INVENTION

1. Field of the Invention

This invention relates to a semiaqueous cleaning composition that is particularly useful for cleaning organic and inorganic compounds or "polymers" (post etch residues) from a semiconductor substrate. As used herein, the term "semiaqueous" refers to a mixture of water and organic solvent. The invention also includes methods of using this composition to clean residues from semiconductor substrates. More particularly, the invention describes a semiaqueous cleaning composition and processes for its use. The solutions are organoammonium compound and amine carboxylate compound free and contain fluoride compounds, water, and solvent and optionally contain corrosion inhibitors, chelating agents, surfactants, acids and bases.

2. Description of Related Art

Fluoride containing chemistries have been used for many years to clean prime silicon wafers (wafers that have not yet undergone ion implantation or device construction) in the semiconductor industry. Normally the fluoride chemistry (usually dilute hydrofluoric acid) is used as the last process step in the sequence called "RCA rinses". The substrate is often contaminated from previous process steps with monolayer amounts of metal, anions and/or organic contaminants or surface residues (particles). These contaminants have been shown to have significant impact on the electrical integrity of simple test device structures and they need to be efficiently cleaned without impairing their integrity. Such cleaning methods could include techniques discussed in the technical literature, for example, Int. Conf. On Solid State Devices and Materials, 1991, pp. 484–486 or Kujime, T. et al., Proc. of the 1996 Semi. Pure Water and Chemicals, pp. 245–256 and Singer, P. *Semi. International*, p.88, October 1995.

Patents that teach methods for cleaning prime wafers with low pH solutions include U.S. Pat. Nos. 5,560,857 and 5,645,737; 5,181,985; 5,603,849; 5,705,089.

Using fluoride chemistries (usually HF) as a final RCA cleaning step will cause the silicon wafer surface to be in a hydrophobic state (the surface is covered with Si—H groups) which will repel water. During this cleaning step a certain proportion of the wafer surface is dissolved (removed). Unless the cleaning conditions are carefully monitored (time, temperature, solution composition) the substrates can be damaged, as reported by Rafols, C. et al., *J Electroanalytic Chem.* 433, pp. 77–83, 1997. Numerous compositions combine water and organic solvents. The water concentration in these HF solutions is very critical. Silica oxide has an etch rate of 21 Å/min (@ 25° C.) in HF/water, but in isobutanol the rate was reduced to 2.14 Å/min and even lower in acetone (an aprotic solvent) the rate was only 0.12 Å/min, as reported at NSF/SRC Eng. Res. Center, Environmentally Benign Semiconductor Manufacturing, Aug. 5–7, 1998, Stanford University.

After the Front End of Line (FEOL) cleaning process the wafer proceeds to the typical Back End of Line (BEOL) manufacturing process for a semiconductor devices, in which the devices might be dynamic random access memories (DRAMs), static random access memories (SRAMs), logic, electrically programmable read only memories (EPROMs), complementary metal on silicon (CMOS), and the like. Etching fabrication technology using chemical reactions (liquid or plasma) has been used as a method of forming a wiring structure on such semiconductor substrates.

A photoresist film is deposited on the wafer to form a mask, then a substrate design is imaged on the film layer, baked, and the undeveloped image is removed with a photoresist cleaner. The remaining image is then transferred to the underlying material (either a dielectric or metal) with reactive etching gases promoted with plasma energy. The etchant gases selectively attack the unprotected area of the substrate. Liquid etching chemistries, usually containing fluoride chemistries have been used extensively over the years to etch metals (Al) and dielectrics. The fluoride chemistries can be very aggressive and can result in isotropic etching (etching equally in all directions). Isotropic etching effects cannot be tolerated with today's needs for tight critical dimension control, though there have been attempts to control the isotropic etch through statistical process control techniques, as reported by Taylor, D., *Solid State Technology*, July 1998, p. 119.

The usual plasma etching process involves anisotropic (unidirectional) etching while at the same time the byproducts (composed of photoresist, etching gasses and etched materials) are deposited on the sidewall of etched openings as residues.

A disadvantage of forming this protective sidewall deposit is that it can be very difficult to remove the residue after the etching procedure. If the components in these residues are not removed or neutralized in some manner then the residues will absorb moisture and form acidic species that can corrode the metal structures. The resultant acid corrodes wiring materials to bring about an adverse effect such as an increase in electrical resistance and wire disconnection.

Such problems frequently occur, in particular in aluminum and aluminum alloys generally used as wiring material. The wafer substrate in contact with acidic materials, if not controlled, can destroy the metal structures.

Following completion of the etching operation it is necessary that the resist mask be removed from the protective surface to permit finishing operations. It is desirable to develop an improved cleaning composition to remove the organic polymeric substance from a coated inorganic substrate without corroding, dissolving or dulling the metal circuitry or chemically altering the wafer substrate.

Cleaning compositions used for removing photoresist coatings if not already ashed and other substrates have for the most part been highly flammable, generally hazardous to both humans and the environment, and comprise reactive solvent mixtures exhibiting an undesirable degree of toxicity. Moreover, these cleaning compositions are not only toxic, but their disposal is costly since they might have to be disposed of as a hazardous waste. In addition, these compositions generally have severely limited bath life and, for the most part, are not recyclable or reusable.

Side wall residues have been removed with either acidic organic solvents or alkaline organic solvents. The acidic solvents are generally composed of phenolic compounds or chloro-solvent and/or an aromatic hydrocarbon and/or alkylbenzenesulfonic acids. These formulations generally need to be used at temperatures up to and beyond 100° C. These chemistries normally need to be rinsed with isopropanol.

Dilute hydrofluoric acid solutions can under certain conditions remove the sidewall polymers by aggressively attacking the via sidewall of the dielectric and therefore changing the dimensions of the device, as taught by Ireland, P., *Thin Solid Films*, 304, pp. 1–12 (1997), and possibly the dielectric constant. Previous chemistries that contain HF, nitric acid, water and hydroxylamine are aggressive enough to etch silicon, as taught by U.S. Pat. No. 3,592,773 issued to A. Muller. Recent information also indicates that the dilute HF solutions can be ineffective for cleaning the newer CF, etch residues, as taught by K. Ueno et al., "Cleaning of CHF$_3$ Plasma-Etched SiO$_2$/SiN/Cu Via Structures with Dilute Hydrofluoric Acid Solutions," *J. Electrochem. Soc.*, vol. 144, (7) 1997. Contact holes opened on to the TiSi$_2$ have also been difficult to clean with HF solutions since there appears to be an attack of the underlying TiSi$_2$ layer. There may also be difficulty with mass transport of the chemicals in the narrow hydrophilic contact holes, as taught by Baklanov, M. R. et al., *Proc. Electrochem. Soc.*, 1998, 97-35, pp. 602–609.

The photoresist around the contact hole of common interlayer dielectrics, TEOS (tetraethylorthosilicate) and boron phosphosilicate glass (BPSG), which are commonly used in ultra large scale integration (ULSI) structures for better conformity of step coverage, is usually removed with HF solutions. It is not uncommon for the HF to also attack the dielectric material. Such attack is not desirable (see Lee, C. and Lee, S, *Solid State Electronics*, 4, pp 921–923 (1997)).

The alkaline organic solvents for post etch residue removal can be composed of amines and/or alkanolamines and/or neutral organic solvents. These formulations generally must be used at temperatures above 100C. Recently a new class of post etch residue cleaning chemistries has been used to clean these substrates. These chemistries include hydroxylamine, amines, alkanolamines and corrosion inhibitors and generally operate at temperatures 20 to 30 degrees lower.

Recently, fluoride-based chemistries have been used in limited cases to remove post etch residues and to a limited extent, photoresist residues from integrated circuit substrates during BEOL (Back End of Line) processes. Many of the wafer cleaning compositions contain fluoride components, specifically hydrogen fluoride. In addition these compositions might contain strong caustic chemicals (choline-derivatives, tetraalkyl ammonium hydroxide, ammonium hydroxide) such as disclosed in U.S. Pat. No. 5,129,955; U.S. Pat. No. 5,563,119; or U.S. Pat. No. 5,571,447, or might use a two-phase solvent system, which contains one phase with hydrofluoric acid and water while a second phase contains a nonpolar organic solvent (ketones, ethers, alkanes or alkenes) (U.S. Pat. No. 5,603,849). Other formulations include hydroxylamine and ammonium fluoride (U.S. Pat. No. 5,709,756, issued to Ward). Additional examples include quaternary ammonium salt and fluoride based compositions, as disclosed in published European Application 662705, and organocarboxylic ammonium salt or amine carboxylate and fluoride based compositions, as disclosed in U.S. Pat. No. 5,630,904.

Some chemistries have also included chelating agents to help remove ionic and anionic contamination from the wafer surface (PCT US98/02794) but chelating agents such as citric acid, gallic acid, and catechol among others, can be aggressive toward the aluminum oxide that covers the Al metal lines. Studies by Ohman and Sjoberg show that the strong complexing ability of citric ions can increase the aluminum oxide solubility and thereby expose the metal to further corrosion, by factors of 166 and 468 at pH 5 and 6 (see Ohrnan et al., *J. Chem. Soc., Dalton Trans.* (1983), p. 2513).

Other methods for cleaning metal and metal oxide residues on wafers include spraying water vapor into the plasma ashing chamber followed by introducing fluorine containing gases (hydrofluoric acid) (U.S. Pat. No. 5,181,985) or a liquid containing hydrofluoric acid, ammonium fluoride and water with a pH between 1.5 to less than 7.

There is also a need to remove particulate residues from the wafer surfaces during the BEOL process. Currently most processes rely on an isopropanol and/or DI water rinse with/or without ultra- or megasonic cleaning. For post chemical mechanical polishing (CMP) cleaning of oxide wafers, normally only DI water is used, but with tungsten wafers a combination of dilute NH$_4$OH and dilute HF usually are required There are five mechanisms for removing impurities particles and/or ions) from the wafer surfaces:

1. Physical desorption by solvents, which involves replacing a small number of strongly absorbed particles with a large volume of weakly adsorbed solvent (changing the interaction of the surface charges);
2. Change the surface charge with either acids or bases, i.e. the Si—OH group can be made positive or protonated with acid or made negative with bases by removing the proton;
3. Ion complexion by removing adsorbed metal ions by adding acid (i.e. ion exchange);
4. Oxidation or decomposition of impurities, which involves oxidation of metals, organic materials or the surface of slurry particles, will change the chemical forces between the impurities and substrate surface. The chemical reaction can either be through redox chemistry or free radicals;
5. Etching the oxide surface, which releases the impurity while dissolving a certain thickness of the substrate surface.

Currently available fluoride-based chemistries can help in items #2 and 5, but the cleaning conditions must be carefully controlled. In many cases, the components of the cleaning compositions are relatively toxic reactive solvent mixtures and thus must be subject to stringent use conditions and require hazardous chemical handling procedures and wearing of safety garments and apparel by users so as to avoid contact with the cleaning compositions. Additionally, because many of the toxic components of such cleaning compositions are highly volatile and subject to high evaporation rates, they require special human and environmental safety precautions to be taken during storage and use of the compositions.

Accordingly, there exists a need to develop improved cleaning compositions to efficiently clean a variety of deposits from a wide variety of substrates. Particularly in the field of integrated circuit fabrication, it should be recognized that the demands for improved cleaning performance with avoidance of attack on the substrates being cleaned are constantly increasing. This means that compositions that were suitable for cleaning less sophisticated integrated circuit substrates may not be able to produce satisfactory results with substrates containing more advanced integrated circuits in the process of fabrication.

These compositions should also be economical, environmental friendly and easy to use.

The present invention teaches such a new and improved cleaning composition and a process for its use. This composition is aqueous, dissolves both organic and inorganic substances, and, when used in the process, is able to clean a variety of substrates. The composition provides a more effective cleaning of the substrates, which means more effective residue removal, which in turn means that higher product yields can be obtained from the substrates being cleaned.

SUMMARY OF THE INVENTION

The novel cleaning compositions of the invention exhibit synergistically enhanced cleaning action and cleaning capabilities at low temperatures that are not possible from the use of the individual components, or the components in combination with other cleaning components, or the components in combination with other cleaning components such as ethoxyethanolamine or alkylamides.

It is a general object of the invention to provide a semiconductor substrate cleaning composition that is effective at low temperatures.

It is a further object of the invention to provide a post etch residue cleaning composition that inhibits redeposition of metal ions.

It is a further object of the invention to form such a cleaning solution that is not flammable.

It is a further object of the invention to provide such a cleaning solution having low etch rates of silicon oxide.

It is a further object of the invention to provide such a cleaning solution and a process which removes post etch residues from metal structures.

It is a further object of the invention to provide such a cleaning solution and a process which removes post etch residues from vias.

It is a further object of the invention to provide such a cleaning solution and a process which removes post etch residues from low k dielectrics.

These and related objects are attained through the use of the composition and process disclosed herein.

A composition in accordance with this invention is for the cleaning of residues from substrates and is organoammonium and amine carboxylate free. It comprises from about 0.01 percent by weight to about 10 percent by weight of one or more fluoride compounds, from about 20 percent by weight to about 50 percent by weight water, from about 20 percent by weight to about 80 percent by weight of a lactam solvent and from 0 to about 50 weight percent of an organic sulfoxide or glycol solvent. The composition has a pH between about 6 and about 10. Additionally, the composition optionally contains corrosion inhibitors, chelating agents, surfactants, acids and bases.

A process for cleaning residue from a substrate in accordance with this invention comprises contacting the substrate with an organoammonium and amine carboxylate free composition comprising one or more fluoride compounds, water and lactam solvent at a temperature and for a time sufficient to clean the substrate.

DETAILED DESCRIPTION OF THE INVENTION

Figure 1:
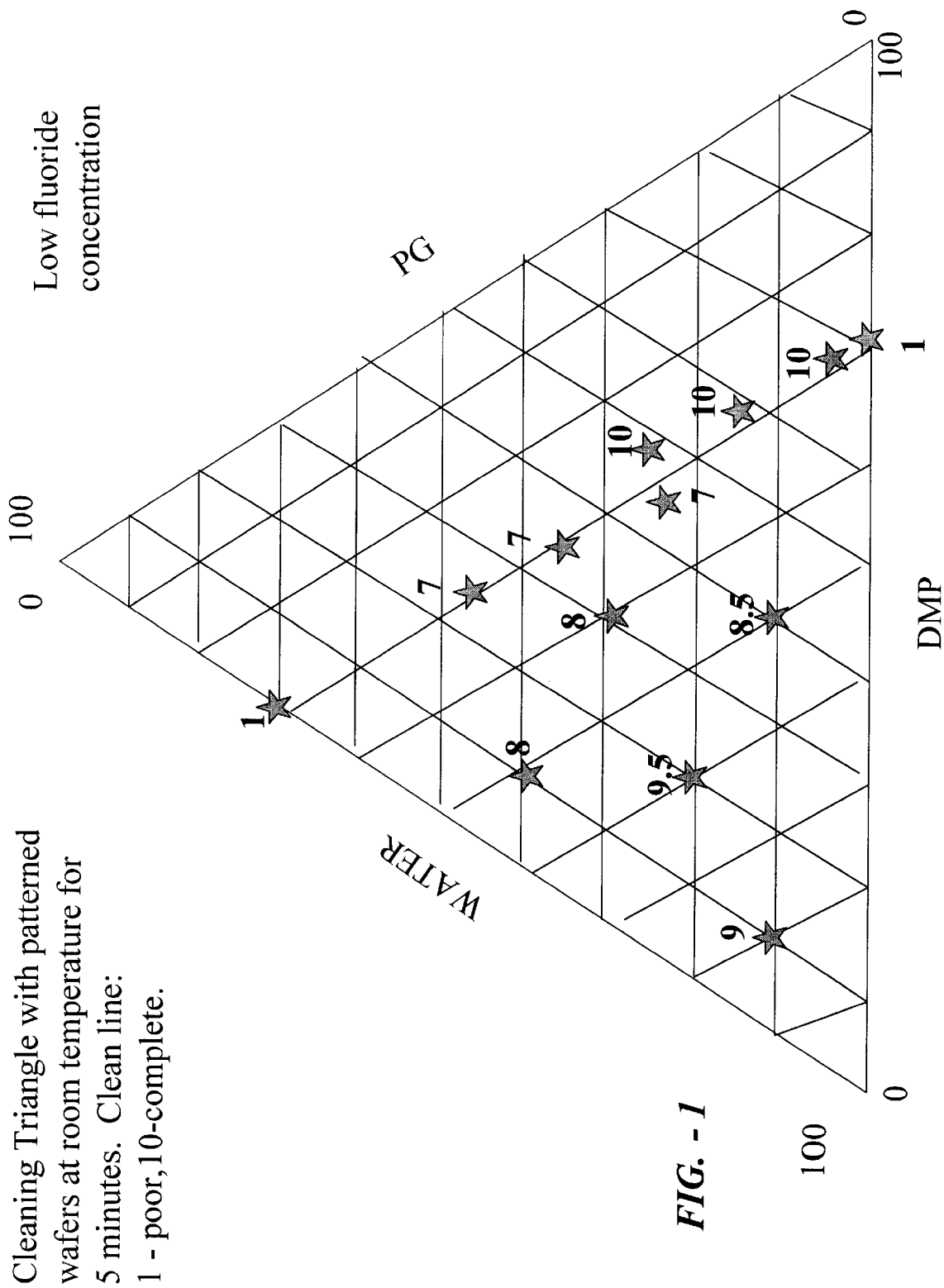
FIGS. 1 and 2 are triangle diagrams plotting cleaning results achieved in practice of the invention as a function of composition.

The cleaning composition of this invention is organoammonium and amine carboxylate free. Several advantages are achievable by being able to eliminate organoammonium and amine carboxylate compounds from the compositions. Eliminating these compounds reduces cost of the product. Organoammonium and amine carboxylate compounds are also a class of compound called phase transfer catalysts. Such compounds under certain solvent conditions can accelerate undesirable side reactions; i.e. activation of hydroxide or halide reactions (which can corrode metal surfaces), as reported by "Phase-Transfer Catalysis in Industry," A Practical Guide and Handbook; March 1991, PTC Interface, Inc. Marietta, Ga. The presence of these compounds in the chemistries can also introduce additional cationic and anionic contamination as raw material sources.

The cleaning composition contains one or more fluoride compounds. Suitable fluoride compounds are ammonium fluoride, ammonium bifluoride and hydrogen fluoride. The preferred fluoride compounds are ammonium fluoride and ammonium bifluoride. If hydrogen fluoride is employed, a buffer may be required to bring the pH between about 6 and about 10. The fluoride compounds are desirably present in an amount of from about 0.01 percent by weight to about 10 weight percent, preferably from about 0.05 weight percent to about 5 weight percent. In general, the lower the concentration of the fluoride compound in the composition, the higher the temperature of use needs to be.

The cleaning composition contains one or more lactam solvents. Suitable lactam solvents include lactams having from 4 to 7 membered rings, including 1 to 5 carbon atom alkyl and alkoxy substituted lactams and 5 to 7 member ring alkane substituted lactams. Suitable specific examples of lactam solvents include piperidones, such as 1 to 5 carbon atom alkyl, dialkyl and alkoxy, dialkoxy piperidones, including N-methyl piperidone, dimethyl piperidone, N-methoxy piperidone, dimethoxy piperidone, N-ethyl piperidone, diethylpiperidone, diexthoxy piperidone, and the like; cyclohexyl analogues of these piperidones, such as N-methyl pyrrolidone, N-2(hydroxyethyl-2-pyrrolidone, N-2(cyclohexyl)-2-pyrrolidone, and the like. The preferred lactam solvents are N-methyl piperidone, dimethyl piperidone and N-methyl pyrrolidone. Dimethyl piperidone is commercially available as a mixture of predominantly 1,3 dimethyl piperidone and a minor amount of 1,5 dimethyl piperidone. The lactam solvents can be used either singly or as mixtures. The composition optionally contains alkyl sulfoxides such as dimethyl sulfoxide and/or glycols, such as propylene glycol.

The cleaning composition contains water. Typically high-purity deionized water is used.

The composition optionally contains corrosion inhibitors. Suitable corrosion inhibitors include inorganic nitrate salts such as ammonium, potassium, sodium and rubidium nitrate salts, aluminum nitrate and zinc nitrate.

The composition optionally contains chelating agents. Suitable chelating agents are described in commonly assigned U.S. Pat. No. 5,672,577, issued Sep. 30, 1997 to Lee, which is incorporated herein by reference. Preferred chelating agents include catechol, ethylenediaminetetraacetic acid, citric acid, pentandione and pentandione dioxime.

The composition optionally contains surfactants. Suitable surfactants include poly(vinyl alcohol), poly(ethyleneimine) and any of the surfactant compositions classified as anionic, cationic, nonionic, amphoteric, and silicone based. Preferred surfactants are poly(vinyl alcohol) and poly(ethyleneimine).

Some combinations of components require the addition of acids and/or bases to adjust the pH to an acceptable value. The acids suitable for use in the present invention are organic or inorganic. The acids can include nitric, sulfuric, phosphoric, hydrochloric acids (though hydrochloric acid can be corrosive to metals) and the organic acids, formic, acetic, propionic, n-butyric, isobutyric, benzoic, ascorbic, gluconic, malic, malonic, oxalic, succinic, tartaric, citric, gallic. The last five organic acids are examples of chelating agents.

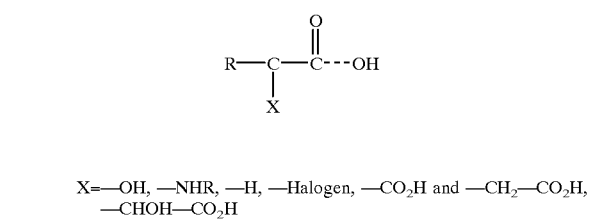

R=generally aliphatic, H or aromatic

Concentrations of the acids can vary from about 1 to about 25 wt percent. The important factor is the solubility of the acid and base products with any additional agents in the aqueous solutions.

The caustic components suitable for use to adjust the pH of the cleaning solution can be composed of any common base, i.e. sodium, potassium, magnesium hydroxides, or the like. The major problem is that these bases introduce mobile ions into the final formulation. Mobile ions could destroy computer chips being produced today in the semiconductor industry. Other bases can include choline (a quaternary amine) or ammonium hydroxide.

Operation

The method of cleaning a substrate using the cleaning compositions of the present invention involves contacting a substrate having residue thereon, particularly organometallic or metal oxide residue, with a cleaning composition of the present invention for a time and at a temperature sufficient to remove the residue. Stirring, agitation, circulation, sonication or other techniques as are known in the art optionally may be used. The substrate is generally immersed in the cleaning composition. The time and temperature are determined based on the particular material being removed from a substrate. Generally, the temperature is in the range of from about ambient or room temperature to 100° C. and the contact time is from about 30 seconds to 60 minutes. The preferred temperature and time of contact for this invention is 20 to 45° C. from 2 to 60 minutes. Generally the substrate will be rinsed after using the composition. Preferred rinse solutions are isopropanol and DI water.

The compositions of the invention are particularly useful for removing residue from metal and via features. The compositions of the invention are particularly useful on low-k dielectrics. Low-k dielectrics are known in the art and include fluorinated silicate glass (FSG), hydrido organo siloxane polymer (HOSP), low organic siloxane polymer (LOSP), nanoporous silica (Nanoglass), hydrogen silsesquioxane (HSQ), methyl silsesquioxane (MSQ), divinysiloxane bis(benzocyclobutene) (BCB), silica low-k (SiLK), poly (arylene ether) (PAE, Flare, Parylene), and fluorinated polyimide (FPI).

Examples of cleaning compositions and processes according to the present invention suitable for removing resist mask or residues from a substrate are set forth in examples below.

EXAMPLE 1

A group of cleaning chemistries containing the ingredients of ammonium fluoride, water, and one of dimethyl piperidone, acetonitrile and hydroxylarnine were tested with metal wafers which have stacks of TEOS/Ti/TiN/AlCu/TiN (from Bottom to Top) etched with $CL_2/BCl_3$ plasma in a commercially available AMT DPS etcher. The resulting metal wafers with residues were cut into small sample pieces, and then the sample pieces were immersed into the chemistry solutions in Table 1 for cleaning for 5 minutes at room temperature. The sample pieces were taken out, rinsed with deionized water and dried with the flow of $N_2$. SEM was performed with a Hitachi 4500 FE-SEM for evaluating cleaning and corrosion effects. Residue removal and corrosion effects on metal stack were assessed by visual comparisons and were all ranked on a scale of 1 to 10. The formulations in table 1 are shown in weight percent.

TABLE 1

| Formula | $NH_4F$ | DI water | ACN | DMP | HDA | Time (Min.) | Metal Lines Clean | Al | Ti | TiN | Oxide |
|---|---|---|---|---|---|---|---|---|---|---|---|
| A | 1 | 35 | 64 | | | 5 | 10 | 7 | 10 | 10 | 10 |
| B | 1 | 35 | | 64 | | 5 | 10 | 8 | 10 | 10 | 10 |
| C | 1 | 35 | | | 64 | 5 | 8 | 10 | 10 | 10 | 10 |

Reaction Temperature: Room Temperature
DI water: Deionized water
ACN: Acetonitrile
DMP: 1,3-Dimethylpiperidone
HDA: Hydroxylamine
Metal Retention for Metal Lines
Clean lines: 1 - poor 10 - complete
Al retention: 10 - no change, 1 - Metal undercut
Ti retention: 10 - no change, <5 - see attack
TiN retention: 10 - no change, <5 - see attack
Oxide retention: 10 - no change, <5 - see attack The results showed that the DMP containing formulation gave the combination of the best cleaning performance with the smallest extent of corrosion, in the form of a slight attack on aluminum. On this basis, DMP was chosen for further study to provide an enhanced formulation.

EXAMPLE 2

Based on the results in Example 1, formulations with low ammonium fluoride concentrations were evaluated to determine a lower limit for the ammonium fluoride in the cleaning formulations with ammonium fluoride and water and DMP. A commercially available LAM TCP9600 etcher with a $Cl_1/BCl_3$ plasma was used for etching metal wafers with a stack of Oxide/Ti/TiN/AlCu/TiN (from bottom to top). The resulting metal wafers with residues were cut into small sample pieces, and the sample pieces were immersed into the cleaning solutions in Table 2 for cleaning for 5 minutes at room temperature. The sample pieces were taken out, rinsed with deionized water and dried with a flow of $N_2$. SEM was performed with a Hitachi 4500 FE-SEM for evaluating cleaning and corrosion effects. Residue removal and corrosion effects on the metal stack were assessed by visual comparisons and were all ranked on a scale of 1 to 10. The formulations in table 2 are shown in weight percent.

TABLE 2

| Formula | NH₄F | DI water | DMP | Time (Min.) | Clean | Al | Ti | TiN | Oxide |
|---|---|---|---|---|---|---|---|---|---|
| D | 0 | 31 | 69 | 5 | 1 | 10 | 10 | 10 | 10 |
| E | 0.08 | 30.92 | 69 | 5 | 7 | 10 | 10 | 10 | 10 |
| F | 0.12 | 30.88 | 69 | 5 | 6 | 10 | 10 | 10 | 10 |
| G | 0.14 | 30.86 | 69 | 2 | 7 | 10 | 10 | 10 | 10 |
| H | 0.2 | 40.8 | 59 | 2 | 7 | 8.5 | 10 | 10 | 10 |
| I | 0.2 | 20.8 | 79 | 2 | 10 | 10 | 10 | 10 | 10 |
| J | 0.2 | 25.8 | 74 | 2 | 9.5 | 10 | 10 | 10 | 10 |
| K | 0.2 | 30.8 | 69 | 2 | 9 | 10 | 10 | 10 | 10 |

Reaction Temperature: Room Temperature
DI water: Deionited water
DMP: 1,3-Dimethylpiperidone
Metal Retention for Metal Lines
Clean lines: 1 - poor 10 - complete
Al retention: 10 - no change, 1 - metal undercut
Ti retention: 10 - no change, <5 - see attack
TiN retention: 10 - no change, <5 - see attack
Oxide retention: 10 - no change <5 - see attack These results show that significant cleaning results are obtained with compositions containing as little as about 0.1 weight percent of the ammonium fluoride, with no corrosion. Better cleaning results in a shorter treatment time are obtained with an ammonium fluoride concentration of 0.2 weight percent in the formulations.

EXAMPLE 3

The procedure of Example 2 was repeated with formulations containing 0.3 weight percent or 1.0 weight percent of ammonium fluoride and with propylene glycol added as an additional solvent. The results are shown in Tables 3 and 4.

TABLE 3

| | | | | | | Formulation in wt. % | | | | |
|---|---|---|---|---|---|---|---|---|---|---|
| Formula | NH₄F | DI water | DMP | PG | Time (Min.) | Clean | Al | Ti | TiN | Oxide |
| LL | 0.3 | 49.7 | 10 | 40 | 5 | 8 | 6 | 10 | 10 | 10 |
| MM | 0.3 | 59.7 | 20 | 20 | 5 | 9.5 | 5 | 10 | 10 | 10 |
| NN | 0.3 | 49.7 | 40 | 10 | 5 | 8.5 | 4 | 10 | 10 | 10 |
| OO | 0.3 | 79.7 | 10 | 10 | 5 | 9 | 7 | 10 | 10 | 10 |
| PP | 0.3 | 79.7 | 30 | 30 | 5 | 8 | 10 | 10 | 10 | 10 |
| QQ | 0.3 | 39.7 | 24 | 48 | 5 | 10 | 10 | 10 | 10 | 10 |
| RR | 0.3 | 27.7 | 67 | 5 | 5 | 10 | 10 | 10 | 10 | 10 |
| SS | 0.3 | 27.7 | 57 | 15 | 5 | 10 | 10 | 10 | 10 | 10 |
| TT | 0.3 | 27.7 | 0 | 70 | 5 | 1 | 10 | 10 | 10 | 10 |
| UU | 0.3 | 29.7 | 45 | 25 | 5 | 7 | 10 | 10 | 10 | 10 |
| VV | 0.3 | 29.7 | 25 | 45 | 5 | 7 | 10 | 10 | 10 | 10 |
| WW | 0.3 | 29.7 | 69 | 0 | 5 | 1 | 10 | 10 | 10 | 10 |
| XX | 0.3 | 30.7 | 35 | 35 | 5 | 7 | 10 | 10 | 10 | 10 |

Reaction Temperature: Room Temperature
DI water: Deionized water
DMP: 1,3-Dimethylpiperidone
PG: Propylene glycol
Metal Retention for Metal Lines
Clean lines: 10 - complete, 1 - not clean at all
Al retention: 10 - no change, 1 - Al layer gone
Ti retention: 10 - no change, 1 - Ti layer gone
TiN retention: 10 - no change, 1 - TiN layer gone
Oxide retention: 10 - no change, 1 - Oxide layer gone

TABLE 4

| Formula | NH₄F | DI water | DMP | PG | Time (Min.) | Clean | Al | Ti | TiN | Oxide |
|---|---|---|---|---|---|---|---|---|---|---|
| L | 1 | 49 | 10 | 40 | 5 | 8 | 7 | 10 | 10 | 10 |
| M | 1 | 59 | 20 | 20 | 5 | 10 | 6 | 10 | 10 | 10 |
| N | 1 | 49 | 40 | 10 | 5 | 7 | 7 | 10 | 10 | 10 |
| O | 1 | 79 | 10 | 10 | 5 | 8 | 3 | 10 | 10 | 10 |
| P | 1 | 39 | 30 | 30 | 5 | 7 | 10 | 10 | 10 | 10 |
| Q | 1 | 27 | 24 | 48 | 5 | 10 | 10 | 10 | 10 | 10 |
| R | 1 | 27 | 67 | 5 | 5 | 9.5 | 9.5 | 10 | 10 | 10 |
| S | 1 | 27 | 57 | 15 | 5 | 10 | 10 | 10 | 10 | 10 |
| T | 1 | 29 | 0 | 70 | 5 | 8 | 10 | 10 | 10 | 10 |
| U | 1 | 29 | 45 | 25 | 5 | 10 | 10 | 10 | 10 | 10 |
| V | 1 | 29 | 25 | 45 | 5 | 8 | 10 | 10 | 10 | 10 |
| W | 1 | 30 | 69 | 0 | 5 | 10 | 7 | 10 | 10 | 10 |
| X | 1 | 29 | 35 | 35 | 5 | 8.5 | 10 | 10 | 10 | 10 |

Formulation in wt. %

Figure 2:
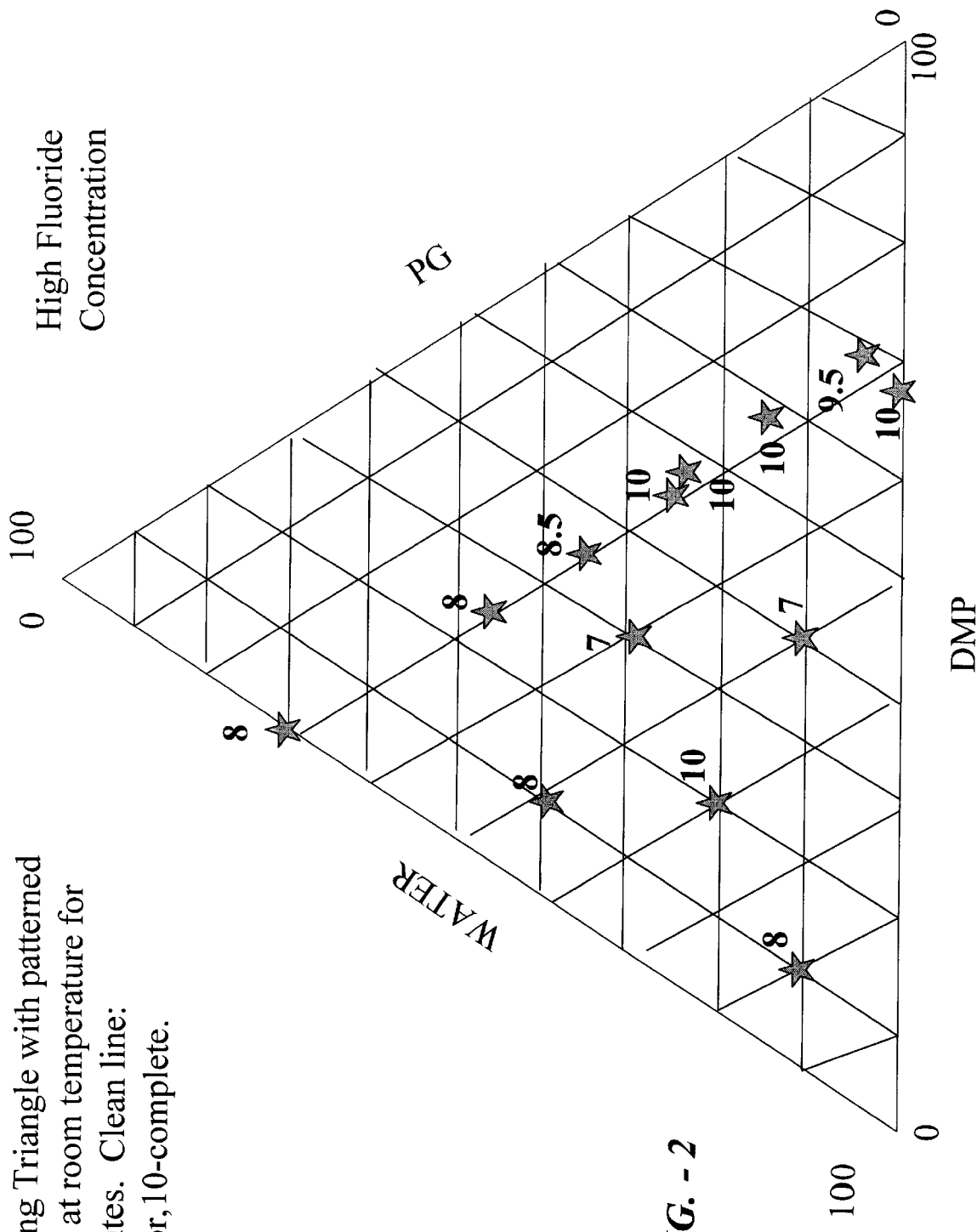
Figure 3:
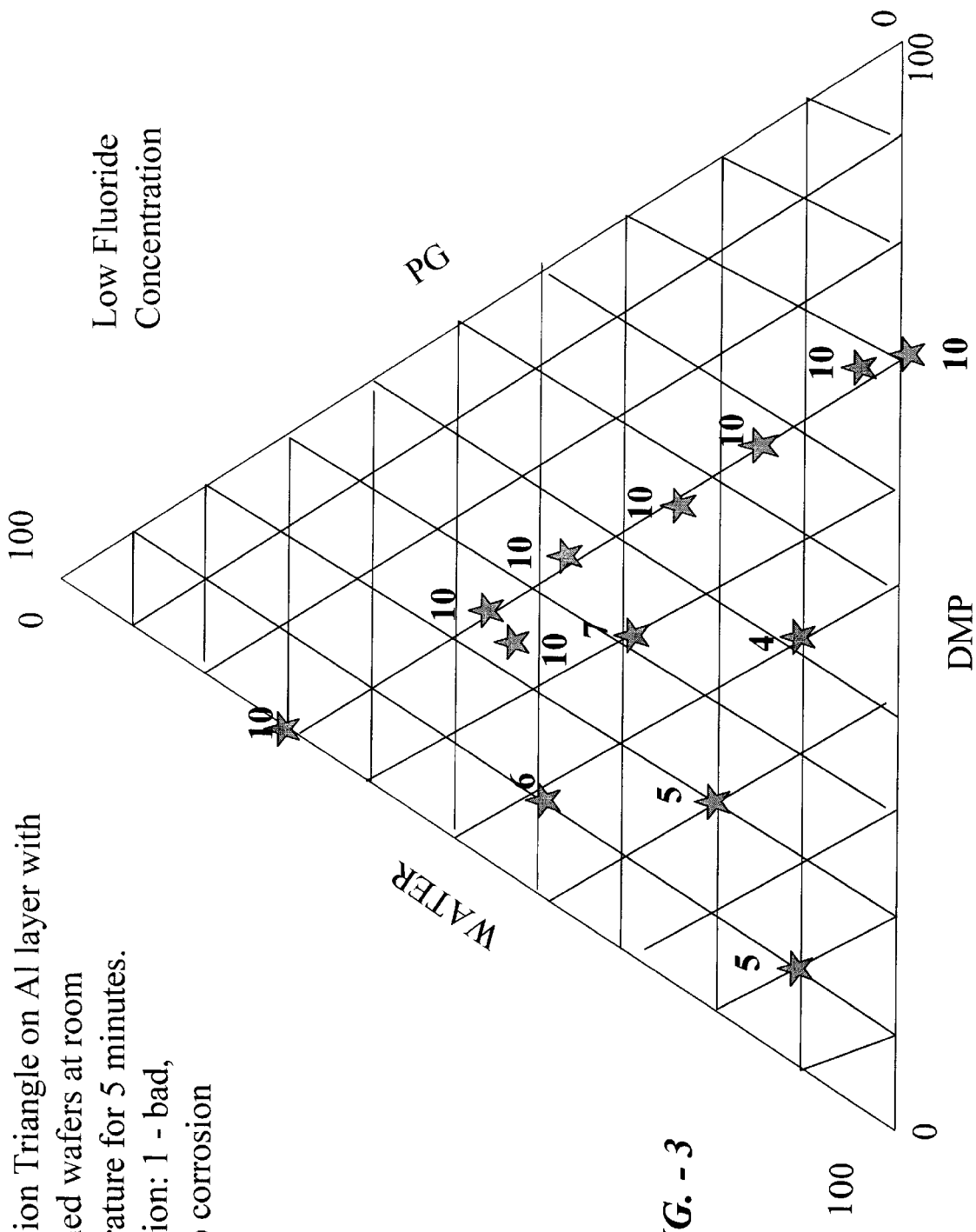
FIGS. 3 and 4 are triangle diagrams plotting corrosion results achieved in practice of the invention as a function of composition.
Figure 4:
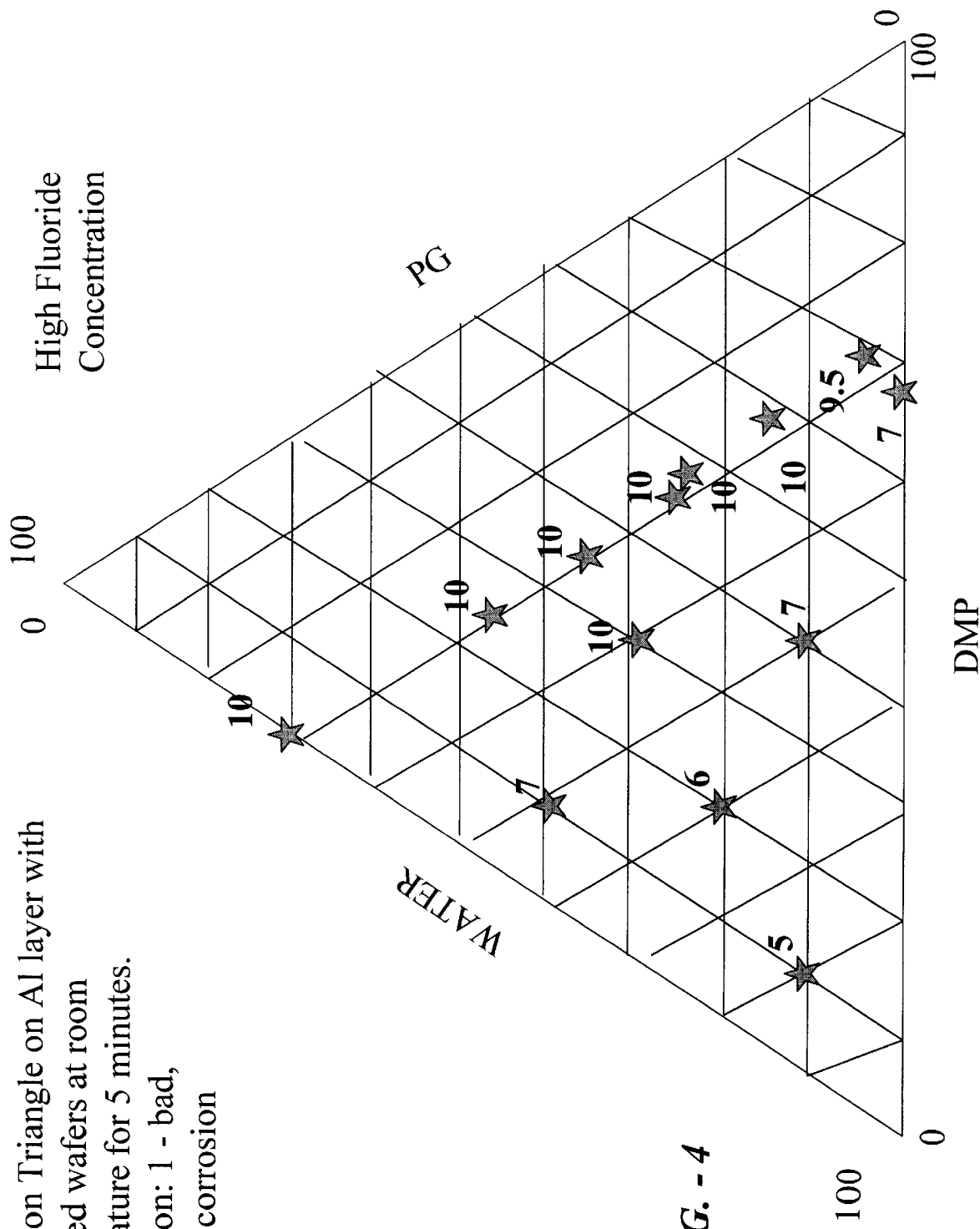
Figure 5:
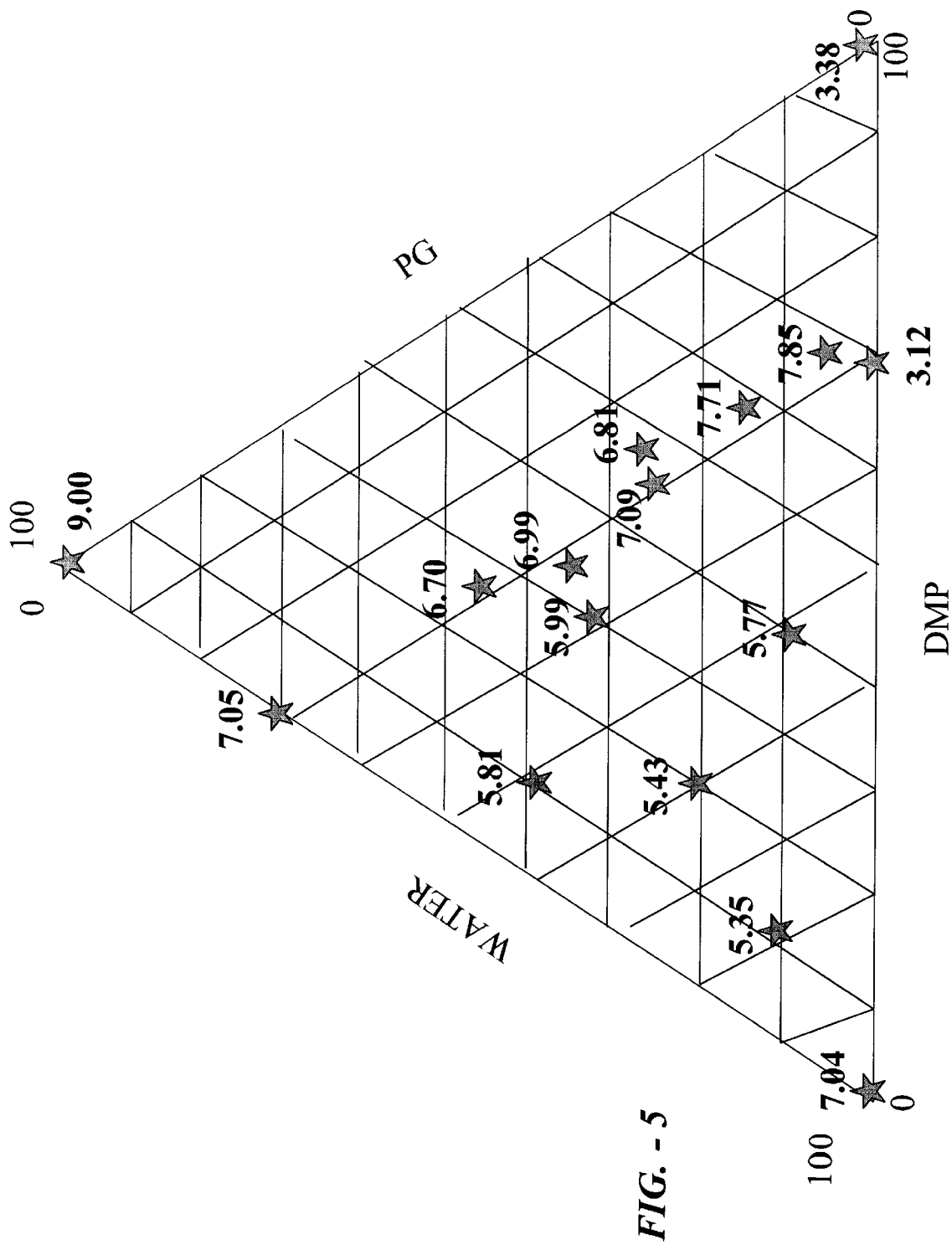
FIG. 5 is a triangle diagram plotting pH as a function of compositions in accordance with the invention.

Reaction Temperature: Room Temperature
DI water: Deionized water
DMP: 1,3-Dimethylpiperidone
PG: Propylene glycol
Metal Retention for Metal Lines
Clean lines: 10 - complete, 1 - not clean at all
Al retention: 10 - no change, 1 - Al layer gone
Ti retention: 10 - no change, 1 - Ti layer gone
TiN retention: 10 - no change, 1 - TiN layer gone
Oxide retention: 10 - no change, 1 - Oxide layer gone In order to understand the results obtained with the formulations shown in Tables 3 and 4, the data was plotted in the four triangle diagrams of FIGS. 1–4, showing respectively, residue cleaning performance as a function of water, DMP and PG concentration in the low fluoride and high fluoride solutions, and aluminum corrosion as a function of water, DMP and PG concentration in the low fluoride and high fluoride solutions. FIG. 5 shows pH of the Table 3 compositions as a function of water, DMP and PG concentration in the solutions. The pH values as reported in FIG. 5 were measured with an Orion SA520 meter with glass pH electrode. A comparison of FIG. 1 with FIG. 2 shows that higher fluoride concentrations are sometimes necessary to obtain satisfactory cleaning results with high water and high DMP concentrations. FIGS. 3 and 4 show that the least corrosion occurs with a high concentration of DMP relative to water. FIG. 5 in combination with FIGS. 1–4 shows the appropriate pH range for avoiding substantial aluminum corrosion and obtaining optimum cleaning results.

EXAMPLE 4

As a result of the above experimental work, an especially preferred composition was determined to be 0.75 % of 40% concentration by weight in water ammonium fluoride, 17% by weight DMSO (dimethyl sulfoxide), 57.25 % by weight DMP (dimethyl piperidone) and 25 % by weight D.I. Water. Further tests in accordance with the procedure of Example 2 gave corrosion numbers of 10 and cleaning numbers of 10 for all of the substrate materials listed in Tables 3 and 4.

Substitution of other fluorine compounds, lactam solvents, organic sulfoxides and other glycols gives similar advantageous results.

One skilled in the art will recognize from the foregoing examples that modifications and variations can, and are expected to be made, to the foregoing cleaning solution in accordance with varying conditions inherent in the production process. The embodiments above are given by way of example. For example, the specific discussion of dielectric preservation is indicative of other metal, metal alloy, and polysilicon structures protected by the proposed cleaning solution and method. The teaching examples do not limit the present invention, which is defined by the following claims.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. An organoammonium and amine carboxylate free composition for the cleaning of residues from substrates, comprising from about 0.01 percent by weight to about 10 percent by weight of one or more fluoride compounds, from about 20 percent by weight to about 50 percent by weight water, from about 20 percent by weight to about 80 percent by weight of a piperidone and from 0 to about 50 weight percent of an organic sulfoxide or glycol solvent, said composition having a pH between about 6 and about 10.

2. The composition of claim 1 in which the piperidone is a 1 to 5 carbon atom alkyl or alkoxy substituted piperidone or a 5 to 7 member ring alkane substituted piperidone.

3. The composition of claim 2 in which the piperidone is a 1 to 5 carbon atom alkyl, dialkyl alkoxy or dialkoxy piperidone.

4. The composition of claim 3 in which the piperidone is N-methyl piperidone, dimethyl piperidone, N-methoxy piperidone, dimethoxy piperidone, N-ethyl piperidone, diethylpiperidone or diexthoxy piperidone.

5. The composition of claim 2 in which the lactam is dimethyl piperidone.

6. The composition of claim 2 in which the fluoride compound is ammonium fluoride, ammonium bifluoride or hydrogen fluoride.

7. The composition of claim 1 in which the fluoride compound is ammonium fluoride, ammonium bifluoride or hydrogen fluoride.

8. The composition of claim 1 further comprising a corrosion inhibitor.

9. The composition of claim 1 further comprising a chelating agent.

10. The composition of claim 1 further comprising a surfactant.

11. The composition of claim 1 further comprising an acid.

12. The composition of claim 1 further comprising a base.

13. The composition of claim 5 in which the fluoride compound is ammonium fluoride.

14. The composition of claim 13 further comprising dimethyl sulfoxide or propylene glycol.

15. A process for cleaning residue from a substrate, which comprises contacting the substrate with an organoammonium and amine carboxylate free composition comprising from about 0.01 percent by weight to about 10 percent by weight of one or more fluoride compounds, from about 20 percent by weight to about 50 percent by weight water, from about 20 percetn by weight to about 80 percent by weight of piperidone and from 0 to about 50 weight percent of an organic sulfoxide or glycol solvent at a temperature and for a time sufficient to clean the substrate.

16. The process of claim 15 in which the temperature is from about 20° to about 100° C.

17. The process of claim 16 where the temperature is about 20° to about 45° C.

18. The process of claim 16 in which the time is from about 3 minutes to about 10 minutes.

19. The process of claim 15 in which the composition has a pH between about 6 and about 10.

20. The process of claim 19 in which the composition additionally comprises from about 0.01 weight percent up to about 50 weight percent of an organic sulfoxide or glycol solvent.

21. The composition of claim 1 in which the piperidone is a compound from the group consisting of N-methyl piperidone and dimethyl piperidone.

* * * * *